(12) United States Patent
Lee

(10) Patent No.: US 7,046,979 B2
(45) Date of Patent: May 16, 2006

(54) RECEIVER FOR REJECTING IMAGE SIGNAL

(75) Inventor: Se-Hyun Lee, Seoul (KR)

(73) Assignee: LG Electronics Inc., Seoul (KR)

( * ) Notice: Subject to any disclaimer, the term of this patent is extended or adjusted under 35 U.S.C. 154(b) by 473 days.

(21) Appl. No.: 10/329,949

(22) Filed: Dec. 27, 2002

(65) Prior Publication Data
US 2003/0125005 A1 Jul. 3, 2003

(30) Foreign Application Priority Data
Dec. 29, 2001 (KR) .................. 10-2001-0088533

(51) Int. Cl.
*H04B 1/10* (2006.01)
(52) U.S. Cl. ............... 455/302; 455/296; 455/303; 455/304

(58) Field of Classification Search ............... 455/130, 455/131, 313, 314, 323, 302, 324
See application file for complete search history.

(56) References Cited

U.S. PATENT DOCUMENTS

| 5,584,066 A | * | 12/1996 | Okanobu ............... 455/302 |
| 6,643,501 B1 | * | 11/2003 | McKeen et al. ........... 455/300 |
| 6,714,604 B1 | * | 3/2004 | Tsurumi et al. ............ 375/329 |
| 2002/0183033 A1 | * | 12/2002 | Gu et al. ................. 455/302 |

* cited by examiner

*Primary Examiner*—Edward F. Urban
*Assistant Examiner*—Christian A. Hannon
(74) *Attorney, Agent, or Firm*—Fleshner & Kim LLP

(57) ABSTRACT

A receiver for rejecting an image signal is provided that does not require a phase-shifter and that requires less mixers than prior receivers. Thus, the phase imbalances and gain mismatches imparted by phase shifters are avoided, and harmonics due to non-liner effects in the mixers are reduced.

28 Claims, 9 Drawing Sheets

RECEIVER FOR REJECTING IMAGE SIGNAL

BACKGROUND OF THE INVENTION

1. Field of the Invention

The present invention relates to a receiver for rejecting an image signal, and in particular to a receiver for rejecting an image signal which is capable of removing imbalance generated by gain and phase errors.

2. Background of the Related Art

In a mobile communication system, because a signal frequency carrying information, such as audio, data and picture information, is a very low base band frequency, it has to be modulated into a high frequency signal for transmission and, when the signal reaches a receiver, it has to be demodulated into an initial frequency band. Receivers are largely divided into a Heterodyne type and a Homodyne type, according to the type of RF (radio frequency) signal conversion method used.

In a Heterodyne method, a RF signal inputted through a local oscillator and an intermediate frequency oscillator is converted into a base band signal, and the RF signal undergoes two down conversion processes. In the Heterodyne method, because an image signal is generated, an image filter for rejecting the image signal is required, and thus it is difficult to minimize the size of the receiver.

In a Homodyne method for solving the problem of the Heterodyne method, a received RF signal is directly down-converted into a base band signal. The frequency in which the local oscillator is operated is the same as that of the RF signal, and thus a desired signal can be promptly detected without undergoing a process for converting the RF signal into an intermediate frequency (IF) signal. Because the Homodyne-type receiver does not require components for processing an intermediate frequency, it can be made smaller and simpler and can thus used for a mobile communication terminal.

FIG. 1 is a block diagram illustrating a structure of a general super Heterodyne receiver, which is used in most communication systems.

As depicted in FIG. 1, a RF signal from an antenna is inputted to a LNA (low noise amplifier) 2 through a duplexer 1, where it is amplified and then sent to an image rejection filter 3. The image rejection filter 3 removes an image frequency from the amplified RF signal and sends the RF signal to a RF down-mixer 4. The RF down-mixer 4 down-converts a frequency of the RF signal into an IF band by mixing the RF signal with a low oscillator (LO) frequency supplied from a RF local oscillator 5. An intermediate frequency passes a channel select filter 6 and is amplified in an If, amplifier 7. A low noise-amplified IF signal is mixed with a LO frequency supplied from an IF local oscillator 9 in an IF down-mixer 8 and is down-converted into a base band. The base band signal passes a LPF (low pass filter) 10 (and is extracted as a desired signal.

The image rejection filter 3 is a band pass filter used at an input side of a mixer in order to prevent a performance lowering phenomenon at an output side of the mixer, by removing an image frequency element symmetric with respect to a reference frequency in a frequency mixing process.

A receiver having a Hartley structure and a receiver having a Weaver structure can reject an image signal without using an image rejection filter by applying a SSB (single side band) modulation technique to the Heterodyne method.

A receiver having a Hartley structure rejects an image signal by dividing an input signal into an I-signal and a Q signal, and combining the I-signal with the Q-signal after the Q-signal passes through a phase-shifter. A receiver having a Weaver structure rejects an image signal by using two oscillators, each having a frequency as $\omega_1 \gg \omega_2$, and a low-pass filter or a band pass filter. Specifically, a receiver having a Weaver structure uses an oscillator having a frequency as $\omega_2$ instead of a phase-shifter.

A receiver having a Hartley structure and a receiver having a Weaver structure will now be described in detail with reference to the accompanying drawings FIG. 2 illustrates a receiver having a Hartley structure, in accordance with the related art. It includes a first mixer 12a for mixing a RF input signal with an output signal from a local oscillator 11; a second mixer 12b for receiving a signal from the local oscillator 11 that has been phase shifted by $\pi/2$ by a first phase shifter 13, and mixing it with the RF input signal; first and second low-pass filters 14a and 14b for passing a low band of the signal from the first mixer 12a and the signal from second mixer 12b, respectively; a second phase shifter 15 for phase-shifting an output signal from the second low-pass filter 14b by $\pi/2$ and outputting it; an adder 16 for adding the output signal of the second phase-shifter 15 to the output signal of the first low-pass filter 14a, and for rejecting an image signal; a third mixer 18 for mixing an output signal of the adder 16 with an output signal of an intermediate frequency oscillator 17, and down-converting a frequency of the mixed-signal; and a third low-pass filter 19 for outputting a desired signal by passing a low band of an output signal from the third mixer 18.

The operation of a receiver having a Hartley structure will now be described.

A RF (radio frequency) signal inputted to the receiver is divided into an I (cosine)-signal and a Q (sine)-signal by using the first phase shifter 13 and the local oscillator 11. The signals are respectively down-converted into an intermediate frequency in the first mixer 12a and the second mixer 12b. Because a high frequency element of the I signal (A) and the Q-signal (B) respectively outputted from the first and second mixers 12a, 12b is rejected in the first and second low-pass filters 14a, 14b, the down-converted signal as the intermediate frequency and an image signal (C and D) are respectively outputted from the first and second low-pass filters 14a, 14b.

The Q-signal (D) outputted from the second low pass filter 14b is phase-shifted by $\pi/2$ by the second phase-shifter 15, and the phase shifted Q-signal (E) is added to the I-signal (C) outputted from the first low-pass filter 14a, thereby rejecting the image signal. An output signal (F) of the adder 16 is mixed with an output signal of the intermediate frequency oscillator 17 in the third mixer 18, and a frequency of the signal is down-converted. The output signal of the third mixer 18 is filtered through the third low-pass filter 19. The third low-pass filter 19 outputs a base band signal.

When a RF input signal inputted to the receiver is a single tone of $A_{RF} \cos \omega_{RF} t + A_{IM} \cos \omega_{IM} t$, an output of the local oscillator 11 is $A_{LO}(\cos \omega_{LO} t)$, and output of the intermediate frequency oscillator 11 is $A_{IF}(\cos \omega_{IF} t)$. The equations below represent the signals at points A–F in FIG. 2:

A: $\dfrac{A_{RF} A_{LO}}{2}\{\cos(2\omega_{LO} + \omega_{IF})t + \cos\omega_{RF} t\} + \dfrac{A_{IM} A_{LO}}{2}\{\cos(2\omega_{LO} - \omega_{IF})t + \cos\omega_{IF} t\}$ B: $\dfrac{A_{RF} A_{LO}}{2}\{\sin(2\omega_{LO} + \omega_{IF})t - \sin\omega_{RF} t\} + \dfrac{A_{IM} A_{LO}}{2}\{\sin(2\omega_{LO} - \omega_{IF})t + \sin\omega_{IF} t\}$ C: $\dfrac{A_{RF} A_{LO}}{2}(\cos\omega_{IF} t) + \dfrac{A_{IM} A_{LO}}{2}(\cos\omega_{IF} t)$ -continued D: $-\frac{A_{RF}A_{LO}}{2}(\sin\omega_{IF}t) + \frac{A_{IM}A_{LO}}{2}(\sin\omega_{IF}t)$ E: $\frac{A_{RF}A_{LO}}{2}(\cos\omega_{IF}t) - \frac{A_{IM}A_{LO}}{2}(\cos\omega_{IF}t)$ F: $A_{RF}(\cos\omega_{IF}t)$ Herein, $A_{RF}$ is a size of the signal that a user wants to detect and $A_{IM}$ is the size of an image signal.

FIG. 3 illustrates a receiver having a Weaver structure, in accordance with the related art. It includes a first mixer 22a for mixing a RF input signal with an output signal of a first frequency oscillator 21a; a second mixer 22b for receiving a signal from the first frequency oscillator 21a that has been phase shifted by π/2 by a first phase shifter 23a, and mixing it with the RF input signal; first and a second band pass filters 24a and 24b for filtering the signals outputted from the first and second mixers 22a, 22b respectively; a third mixer 25a for mixing an output signal of the first band pass filter 24a with an output signal of a second frequency oscillator 21b; a fourth mixer 25b for receiving a signal from the second frequency oscillator 21b that has been phase shifted by π/2 by the second phase-shifter 23b, and mixing it with an output signal of the second band pass filter 24b; a subtracter 26 for subtracting an output signal of the fourth mixer 25b from an output signal of the third mixer 25c; a fifth mixer 28 for mixing the output signal of the subtracter 26 with the output signal of an intermediate frequency oscillator 27, and down-converting a frequency of the signal; and a low-pass filter 29 for outputting a desired signal by passing a low band of the output signal of the fifth mixer 28.

The operation of the receiver having the Weaver structure will now be described.

A RF signal inputted to the receiver is divided into an I-signal and a Q-signal by using the first frequency oscillator 21a and the first phase-shifter 23a. The signals are respectively mixed with a $\omega_1$ frequency signal outputted from the first frequency oscillator 21a in the first and second mixers 22a, 22b and are down-converted into a $\omega_{RF}-\omega_1$ frequency. Because the I-signal (A) and the Q-signal (B) respectively outputted from the first and second mixers 22a, 22b pass the first and second band pass filters 24a, 24b, a second image signal, that is generated and is centered around a second frequency $\omega_2$, is rejected. Herein, the second image signal is an image signal generated during the down conversion of the signal into the second frequency $\omega_2$.

The output signals (C and D) of the first and second band pass filters 24a, 24b are respectively down-converted in the third and fourth mixers 25a, 25b with the signal of the second frequency oscillator 21b. An output (E) of the third mixer 25a is subtracted from an output signal (F) of the fourth mixer 25b in order to remove an image signal that is centered around a $\omega_{RF}-\omega_1-\omega_2$ frequency. An output signal (G) of the subtracter 26 is inputted to the fifth mixer 28 with the output signal of the intermediate frequency oscillator 27, is down-converted, passed through the low-pass filter 29 and is outputted as a base band signal.

When a RF input signal inputted to the receiver is $A_{RF}\cos(\omega_1+\omega_2+\omega_{IF})t + A_{IM1}\cos(\omega_1-\omega_2-\omega_{IF})t + A_{IM2}\cos(\omega_1+\omega_2-\omega_{IF})t$, an output signal of the first frequency oscillator 21a is $A_{LO}(\cos\omega_1 t)$ and an output signal of the second frequency oscillator 21b is $\cos\omega_2 t$. The equations below represent the signals at points A–G in FIG. 3:

A: $\frac{A_{RF}A_{LO}}{2}(\cos(2\omega_1+\omega_2+\omega_{IF})t + \cos(\omega_2+\omega_{IF})t) +$ $\frac{A_{IM1}A_{LO}}{2}(\cos(2\omega_1-\omega_2-\omega_{IF})t + \cos(\omega_2+\omega_{IF})t) +$ $\frac{A_{IM2}A_{LO}}{2}(\cos(2\omega_1+\omega_2-\omega_{IF})t + \cos(\omega_2-\omega_{IF})t)$ B: $\frac{A_{RF}A_{LO}}{2}(\sin(2\omega_1+\omega_2+\omega_{IF})t - \sin(\omega_2+\omega_{IF})t) +$ $\frac{A_{IM1}A_{LO}}{2}(\sin(2\omega_1-\omega_2-\omega_{IF})t + \sin(\omega_2+\omega_{IF})t) +$ $\frac{A_{IM2}A_{LO}}{2}(\sin(2\omega_1+\omega_2-\omega_{IF})t - \sin(\omega_2-\omega_{IF})t)$ C: $\frac{A_{RF}A_{LO}}{2}(\cos(\omega_2+\omega_{IF})t) + \frac{A_{IM1}A_{LO}}{2}(\cos(\omega_2+\omega_{IF})t)$ D: $-\frac{A_{RF}A_{LO}}{2}(\sin(\omega_2+\omega_{IF})t) + \frac{A_{IM1}A_{LO}}{2}(\sin(\omega_2+\omega_{IF})t)$ E: $\frac{A_{RF}A_{LO}}{4}(\cos(2\omega_2+\omega_{IF})t + \cos\omega_{IF}t) +$ $\frac{A_{IM1}A_{LO}}{4}(\cos(2\omega_2+\omega_{IF})t + \cos\omega_{IF}t)$ F: $\frac{A_{RF}A_{LO}}{4}(\cos(2\omega_2+\omega_{IF})t - \cos\omega_{IF}t) -$ $\frac{A_{IM1}A_{LO}}{4}(\cos(2\omega_2+\omega_{IF})t - \cos\omega_{IF}t)$ G: $\frac{A_{RF}A_{LO}}{2}\cos\omega_{IF}t + \frac{A_{IM1}A_{LO}}{2}\cos(2\omega_2+\omega_{IF})t$ The related art receiver having the Hartley structure implements a π/2 phase-shifter by using resistance and a capacitor. Because the resistance and a capacity of the capacitor may be varied according to a frequency and the surroundings, phase imbalance may occur in the phase-shifter, which can result in a gain mismatch. Accordingly, it is difficult to reject an image signal accurately.

In the related art receiver having a Weaver structure, because a π/2 phase shifter is not used, problems such as phase imbalance or gain mismatch do not occur. However, other problems, such as a second image occurrence and harmonics due to non-linearity in a mixing process after a low-pass filter are present. Thus, it is difficult to match a phase and a size of the signals accurately.

The above references are incorporated by reference herein where appropriate for appropriate teachings of additional or alternative details, features and/or technical background.

SUMMARY OF THE INVENTION

An object of the invention is to solve at least the above problems and/or disadvantages and to provide at least the advantages described hereinafter.

In order to solve the above-mentioned problems, it is an object of the present invention to provide a receiver for rejecting an image signal which is capable of removing phase imbalance that occurs due to variations in the surroundings, and removing gain mismatch due to the phase mismatch by eliminating a phase converter that is constructed with capacitive components, such as resistors and capacitors.

In addition, it is another object of the present invention to provide a receiver for rejecting an image signal which is capable of reducing harmonic influences due to non-linearity by decreasing the number of mixers as non-linear devices.

To achieve at least these advantages, in whole or in part, there is provided a receiver for rejecting an image signal, including a filter unit for extracting a signal within a predetermined band from a radio frequency (RF) input signal; a first signal processing unit for mixing an output signal of the filter unit with an output signal of a first frequency oscillator and outputting a first low frequency signal; a second signal processing unit for mixing the output signal of the filter unit with an output signal of a second frequency oscillator and outputting second a low frequency signal; a subtracter for subtracting the second low frequency signal from the second signal processing unit from the first low frequency signal from the first signal processing unit; and a third signal processing unit for mixing an output signal of the subtracter with an output signal of a third frequency oscillator and outputting a base band signal.

To achieve at least these advantages, in whole or in part, there is further provided a receiver for rejecting an image signal, including a band pass filter for passing a pre determined band of a radio frequency (RF) input signal, wherein the RF signal comprises a desired signal and an image signal; a first mixer for mixing an output signal of the band pass filter with an output signal of a first frequency oscillator; a first low-pass filter for outputting a low frequency signal of an output signal of the first mixer; a second mixer for mixing the output signal of the band pass filter with an output signal of a second frequency oscillator; a second low-pass filter for outputting a low frequency signal of the output signal of the second mixer; a subtracter for subtracting an output signal of the second low-pass filter from an output signal of the first low-pass filter; a third mixer for mixing the output signal of the subtracter with an output signal of a third frequency oscillator; and a third low-pass filter for outputting a desired signal by filtering a low frequency of the output signal of the third mixer.

To achieve at least these advantages, in whole or in part, there is further provided a receiver for rejecting an image signal, including a first low-pass filter for outputting a low frequency of a radio frequency (RF) input signal, wherein the RF input signal comprises desired signal and an image signal; a first subtracter for subtracting the RF input signal from an output signal of the first low-pass filter; a first mixer for mixing an output signal of the first subtracter with an output signal of a first frequency oscillator; a second low-pass filter for outputting a low frequency signal of an output signal of the first mixer; a second mixer for mixing an output signal of the first subtracter with an output signal of a second frequency oscillator; a third low-pass filter for outputting a low frequency signal of an output signal of the second mixer; a second subtracter for subtracting an output signal of the third low-pass filter from an output signal of the second low-pass filter; a third mixer for mixing an output signal of the second subtracter with an output signal of a third frequency oscillator; and a fourth low-pass filter for outputting a desired signal by filtering a low frequency of an output signal of the third mixer.

To achieve at least these advantages, in whole or in part, there is further provided a receiver, including a First signal processor for down-converting at least a portion of a radio frequency (RF) input signal using a signal from a first oscillator and outputting a first down-converted signal, a second signal processor for down-converting the at least a portion of the RF signal using a signal from a second oscillator and outputting a second down-converted signal, and a subtracter for subtracting the second down-converted signal from the first down-converted signal.

To achieve at least these advantages, in whole or in part, there is further provided a receiver, including a first signal processor for down-converting at least a portion of a radio frequency (RF) signal and outputting a first down-converted signal, a second signal processor for down-converting the at least a portion of the RF signal and outputting a second down-converted signal, and a subtracter for subtracting the second down-converted signal from the first down-converted signal, wherein neither of the first and second down-converted signals undergo phase shifting prior to entering the subtracter.

To achieve at least these advantages, in whole or in part, there is further provided a method of removing an undesired frequency component from a radio frequency (RF) signal, including down-converting at least a portion of the RF signal using a signal from a first oscillator to yield a first down-converted signal, down converting the at least a portion of the RF signal using a signal from a second oscillator to yield a second down-converted signal, and subtracting the second down-converted signal from the first down-converted signal to yield a third signal.

To achieve at least these advantages, in whole or in part, there is further provided a method of removing an undesired frequency component from a radio frequency (RF) signal, including down-converting at least a portion of the RF signal to yield a first down-converted signal, down-converting the at least a portion of the RF signal to yield a second down-converted signal, and subtracting the second down-converted signal from the first down-converted signal before phase-shifting either of the first and second down-converted signals to yield a third signal.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Hereinafter, preferred embodiments of a receiver for rejecting an image signal, in accordance with the present invention, will be described with reference to accompanying drawings.

Figure 1:
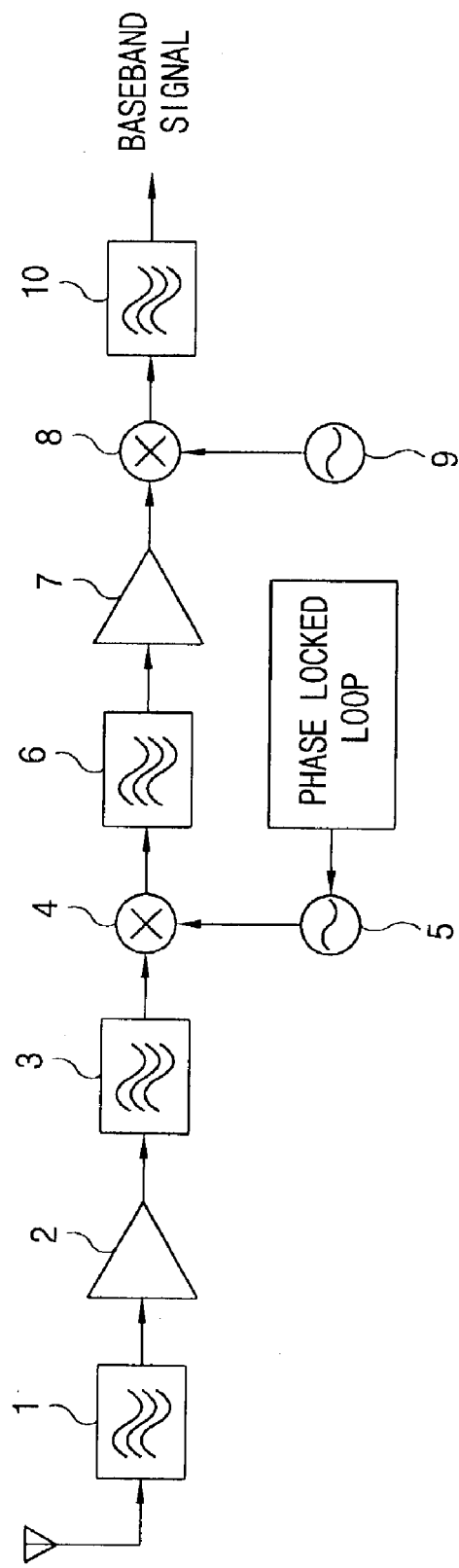
FIG. 1 is a block diagram illustrating a construction of a related art super heterodyne receiver
Figure 2:
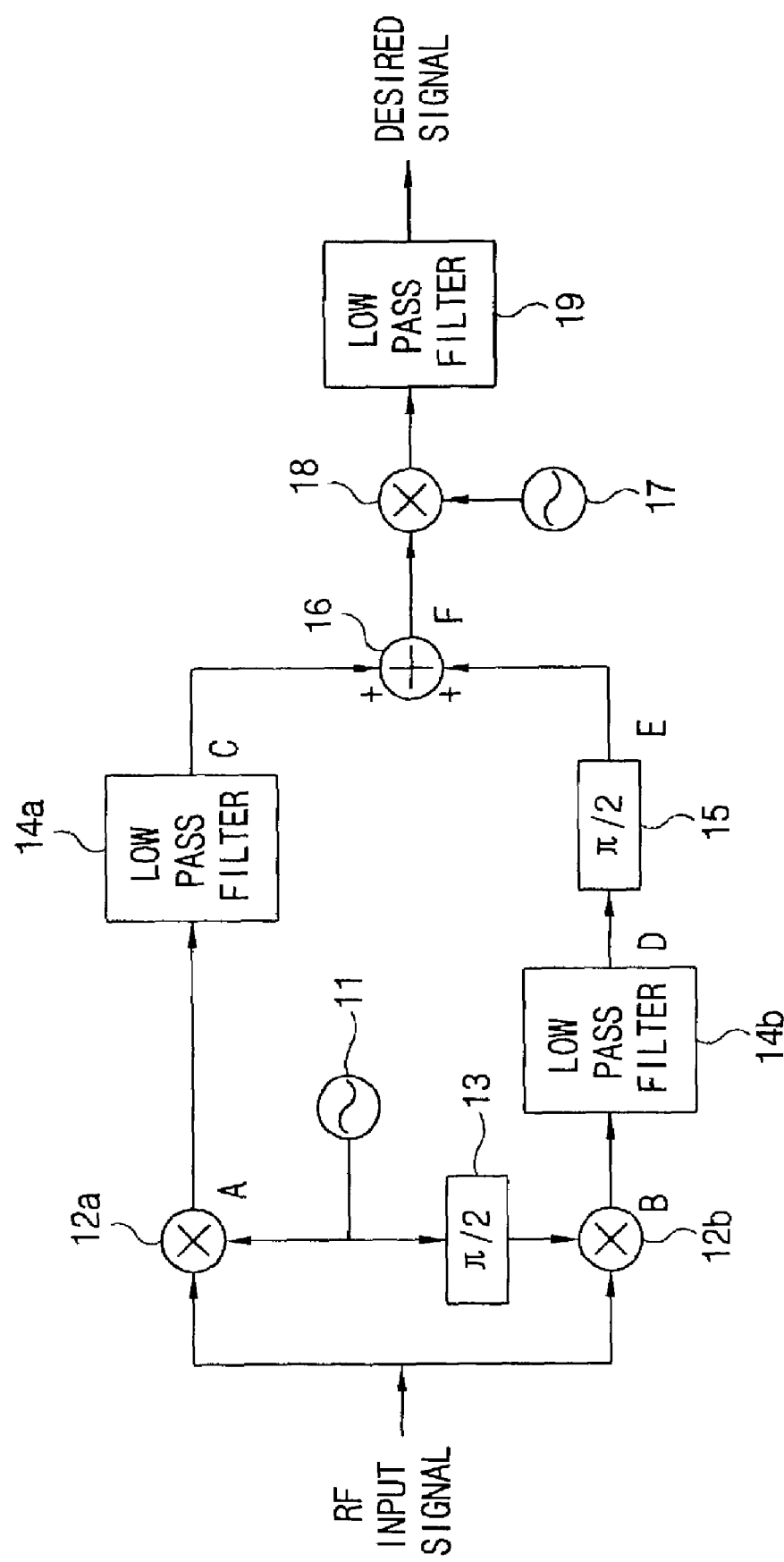
FIG. 2 is a block diagram illustrating a receiver having a Hartley structure, in accordance with the related art.
Figure 3:
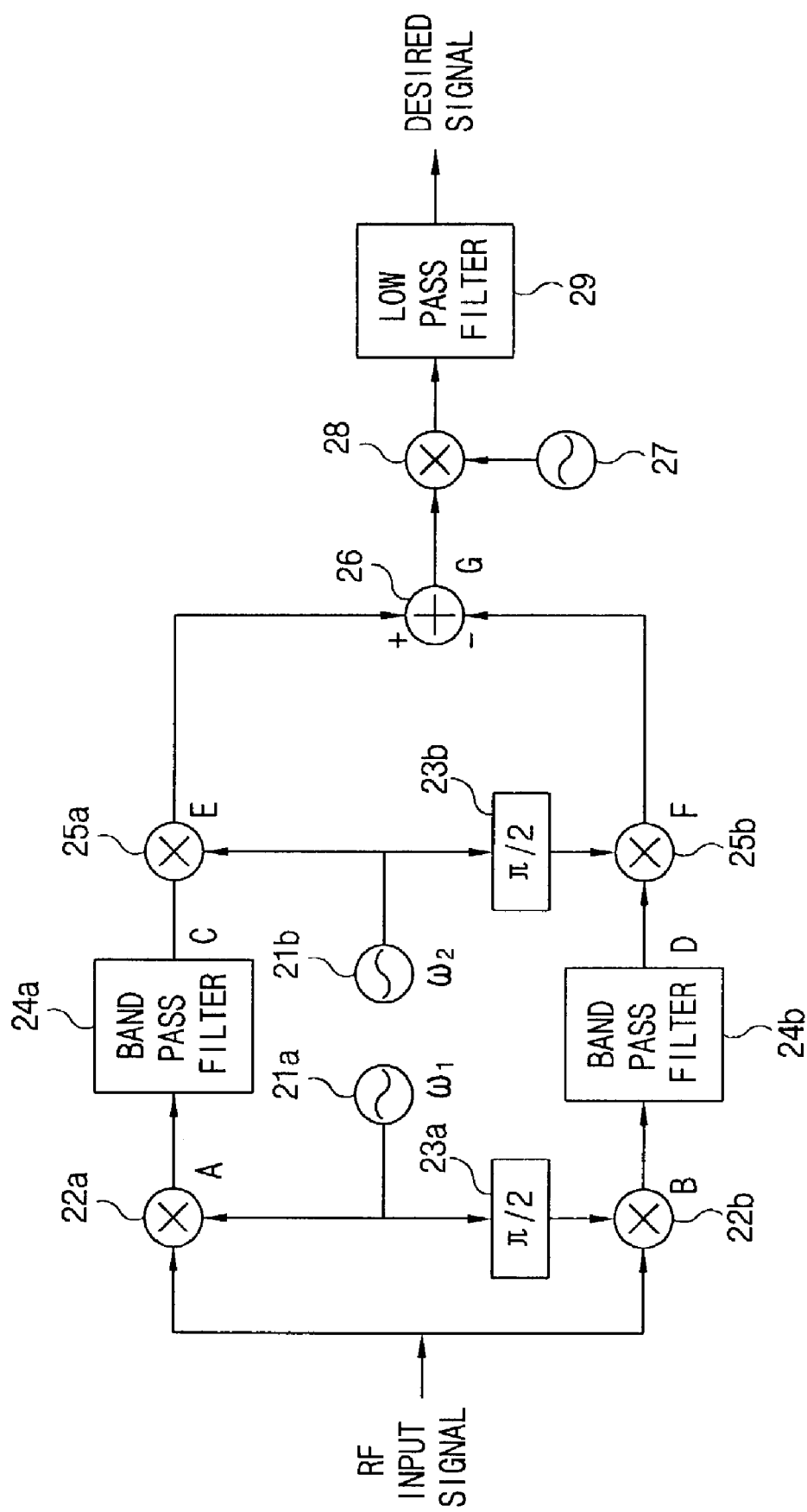
FIG. 3 is a block diagram illustrating a receiver having a Weaver structure, in accordance with the related art.
Figure 4:
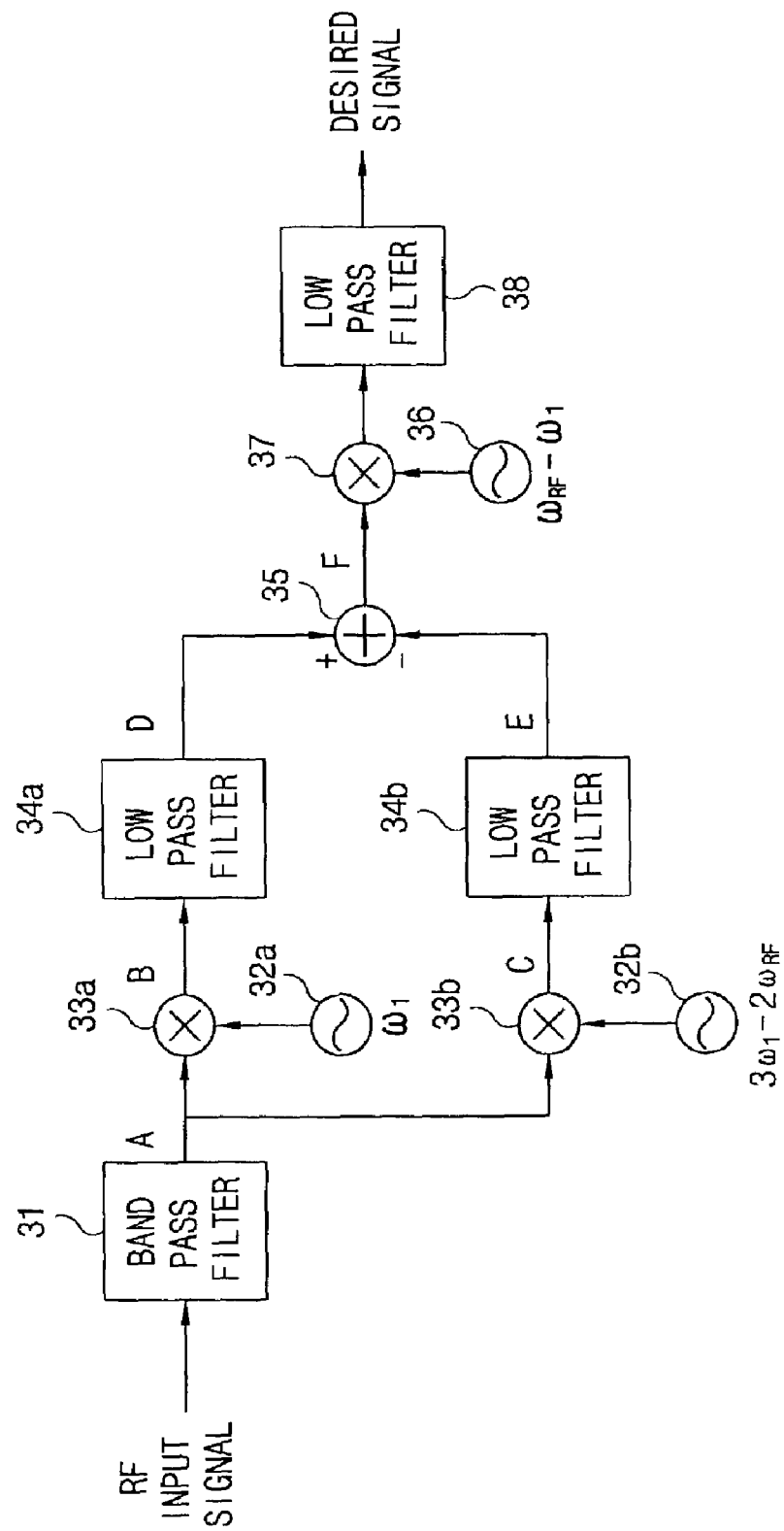
FIG. 4 is a block diagram illustrating a first preferred embodiment of a receiver for rejecting an image signal, in accordance with the present invention.

FIG. 4 is a block diagram illustrating a first preferred embodiment of a receiver for rejecting an image signal, in accordance with the present invention.

As depicted in FIG. 4, the receiver includes a band pass filter 31 for outputting a signal within a certain band by filtering a RF input signal; a first mixer 33a for mixing the output signal of the band pass filter 31 with an output signal of a first frequency oscillator 32a; a second mixer 33b for mixing the output signal of the band pass filter 31 with an output signal of a second frequency oscillator 32b; a first low-pass filter 34a for passing a low frequency of the output signal of the First mixer 33a; a second low-pass filter 34b for passing a low frequency of the output signal of the second mixer 33b; a subtracter 35 for subtracting the output signal of the second low-pass filter 34b from the output signal of the first low-pass filter 34a; a third mixer 37 for mixing the output signal of the subtracter 35 with an output signal of a third frequency oscillator 36; and a third low pass filter 38 for passing and outputting a low frequency of the output signal of the third mixer 37.

The band pass filter 31 removes an image signal generated in down-conversion of an image signal of a desired signal which a user wants to detect through the first frequency oscillator 32a.

The first and second mixers 33a, 33b respectively perform a function of a down converter for down-converting the output signal of the band pass filter 31 according to an oscillation frequency inputted from the first and second frequency oscillators 32a, 32b.

In the present invention, because there is no phase-shifter, it is possible to remove phase imbalance and gain mismatch that occurs in a receiver having a Hartley structure, and reduce the number of mixers relative to a receiver having a Weaver structure, which reduces the influence of non linearities.

The operation of the receiver of FIG. 4 for rejecting an image signal, in accordance with the present invention, will now be described.

The RF input signal includes a desired signal, a first image signal and the second image signal. The second image signal is generated during down-conversion of the first image signal of the desired signal. Specifically, the second image signal is an image signal about the first image signal of the desired signal. The second image signal of the RF input signal is removed by the band pass filter 31, and an output signal of the band pass filter 31 is respectively inputted to the first and second mixers 33a, 33b.

The first mixer 33a mixes the output signal of the band pass filter 31 with a $\omega_1$ frequency signal of the first frequency oscillator 32a and outputs it, and the second mixer 33b mixes the output signal of the band pass filter 31 with a $3\omega_1 - 2\omega_{RF}$ frequency signal of the second frequency oscillator 32b and outputs it. In more detail, the desired signal outputted from the band pass filter 31 and the first image signal about the desired signal are respectively down-converted in the first and second mixers 33a, 33b and are outputted.

High frequency parts of the signals outputted from the first and second mixers 33a, 33b are respectively removed in the first and second low-pass filter 34a, 34b, and the output signal of the first low-pass filter 34a and the output signal of the second low-pass filter 34b are subtracted in the subtracter 35. In the output signal of the first low-pass filter 34a, a center frequency of the desired signal is overlapped with a center frequency of the first image signal. In the output signal of the second low-pass filter 34b, the signal corresponding to the first image signal is outputted. Accordingly, when the subtraction is performed in the subtracter 35, the first image signal is removed, and the desired signal is remained.

The desired signal outputted from the subtracter 35 is mixed with a $\omega_{RF} - \omega_1$ frequency signal of the third frequency oscillator 36 and is down-converted in the third mixer 37. The desired signal is then filtered through the third low-pass filter 38 and is outputted.

The operation of the receiver for rejecting an image signal will be described in detail with reference to Equations 1–4 and FIGS. 5A–5G.

First, Equation 1 shows a RF input signal including a desired signal, a first image signal and a second image signal that is inputted to the receiver.

$$A_{RF}{}^{cos}\omega_{RF}{}^t + A_{IM1}{}^{cos}(2\omega_1 - \omega_{RF})^t + A_{IM2}{}^{cos}(4\omega_1 - 3\omega_{RF})^t \qquad (1)$$

Herein, $A_{RF}$ is a size of the desired signal, $A_{IM1}$ is a size of the first image signal, and $A_{IM2}$ is a size of the second image signal.

Figure 5A:
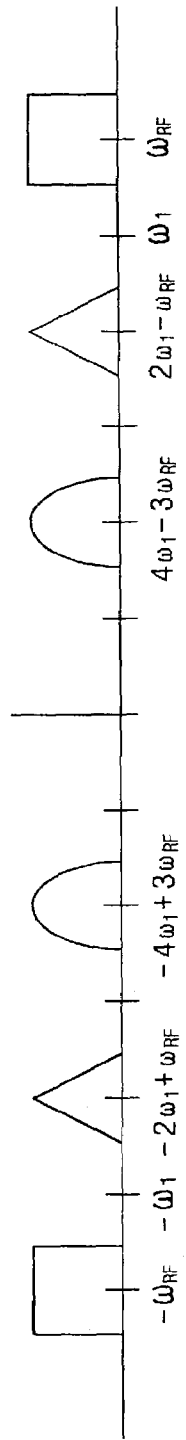
FIGS. 5A–5G are wave diagrams illustrating waveforms generated by receiver of FIG. 4.
Figure 5B:
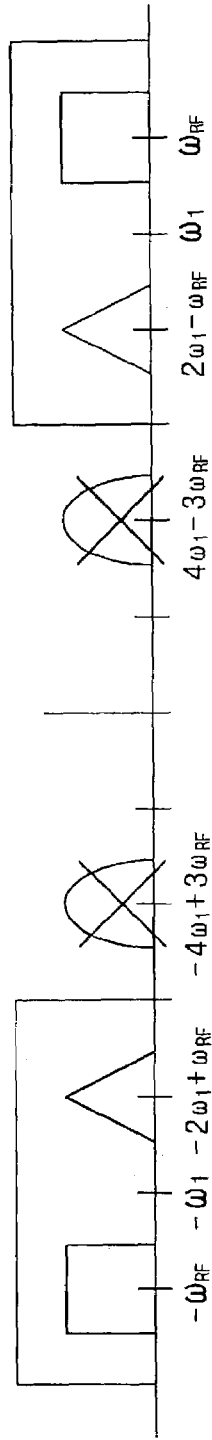

In the RF input signal, a signal within a certain band is outputted through the hand pass filter 31, the RF input signal passes the band pass filter 31 having a band including $\omega_{RF}$ and $2\omega_1 - \omega_{RF}$, and the second image signal having a center frequency as $4\omega_1 - 3\omega_{RF}$ is removed. Equation 2 below represents a signal (A) outputted from the band pass filter 31, FIGS. 5A and 5B show the RF input signal and a signal outputted from the band pass filter 34, respectively.

$$A{:}A_{RF} \cos \omega_{RF}{}^t + A_{IM1} \cos(2\omega_1 - \omega_{RF})^t \qquad (2)$$

The output signal (A) of the band pass filter 31 is inputted to the first and second mixers 33a, 33b. Herein, the first mixer 33a mixes the output signal of the band pass filter 31 with the output signal of the first frequency oscillator 32a and down-converts it. The output signal of the first frequency oscillator 32a is an $\omega_1$ frequency signal, which is assumed is lower than the frequency of the desired signal $\omega_{RF}$.

In addition, the second mixer 33c mixes the output signal of the band pass filter 31 with the output signal of the second frequency oscillator 32b and down-converts it. Herein, the output signal of the second frequency oscillator 32b is a $3\omega_1 - 2\omega_{RF}$ frequency signal.

Figure 5C:
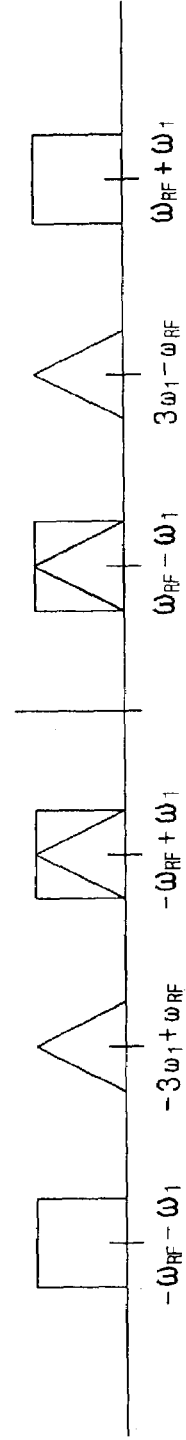
Figure 5D:
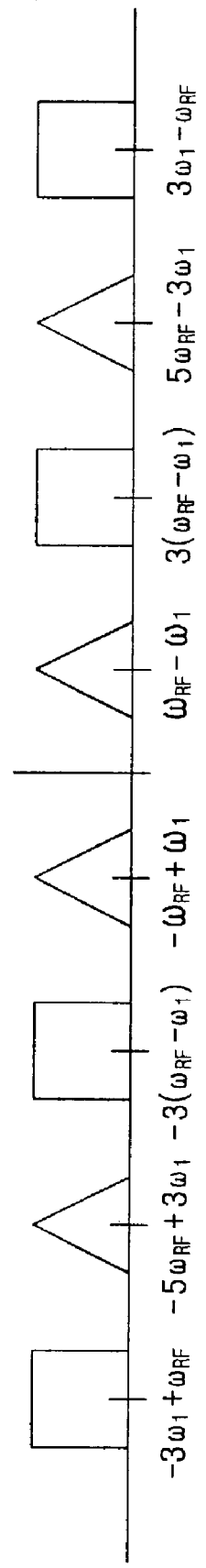
Figure 5E:
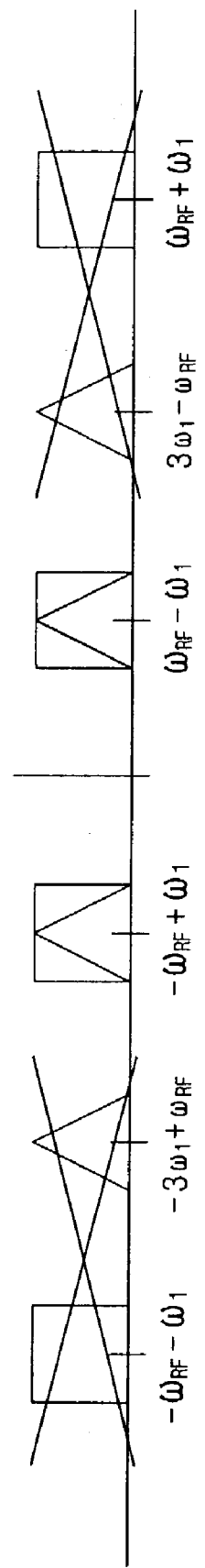
Figure 5F:
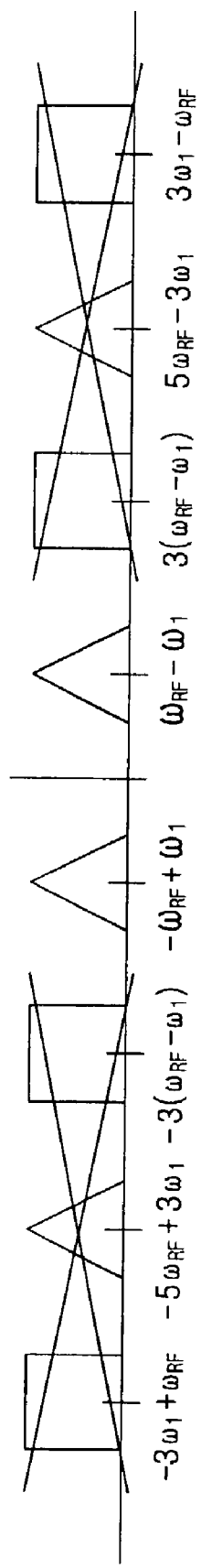

Equations 3 and 4 respectively represent output signals (B and C) of the first and second mixers 33a, 33b, and FIGS. 5C and 5D respectively show the output signals.

$$B: \frac{A_{RF}}{2}(\cos(\omega_1 + \omega_{RF})t + \cos(\omega_{RF} - \omega_1)t) + \qquad (3)$$
$$\frac{A_{IM1}}{2}(\cos(3\omega_1 - \omega_{RF})t + \cos(\omega_{RF} - \omega_1)t)$$

$$C: \frac{A_{RF}}{2}(\cos(3\omega_1 + \omega_{RF})t + \cos(3\omega_{RF} - 3\omega_1)t) + \qquad (4)$$
$$\frac{A_{IM1}}{2}(\cos(5\omega_1 - 3\omega_{RF})t + \cos(\omega_{RF} - \omega_1)t)$$

Herein, the output signal of the first frequency oscillator 32a having a $\omega_1$ frequency and a size of 1, and the output signal of the second frequency oscillator 32b having a $3\omega_1 - 2\omega_{RF}$ frequency and a size of 1 are respectively mixed with the output signal of the band pass filter 31 and are outputted as a high frequency element and a low frequency element. Herein, a range of the $\omega_1$ frequency is within $\tfrac{3}{4}\omega_{RF} < \omega_1 < \omega_{RF}$.

In the frequency range, it is assumed that the signal of the first frequency oscillator 32a has a frequency lower than that of the desired signal, i.e., $\omega_1$ is less than $\omega_{RF}$, and it is assumed that the center frequency of the second image signal has a frequency region greater than 0, i.e., the $4\omega_1-3\omega_{RF}$ frequency of the second image signal is greater than 0, and accordingly the frequency range is determined.

Low frequencies of the output signals (B and C) of the first and second mixers 33a, 33b are outputted respectively through the first and second low-pass filters 34a, 34b. Equations 5 and 6 respectively represent the output signals of the first and second low-pass filters 34a, 34b, and FIGS. 5E and 5F respectively show the signals.

$$D: \frac{A_{RF}}{2}\cos(\omega_{RF}-\omega_1)t + \frac{A_{IMI}}{2}\cos(\omega_{RF}-\omega_1)t \qquad (5)$$

$$E: \frac{A_{IMI}}{2}\cos(\omega_{RF}-\omega_1)t \qquad (6)$$

Herein, an output signal (E) of the second low-pass filter 34b is obtained by using the low-pass filter 34b in order to extract a $\omega_{RF}-\omega_1$ frequency element as a low frequency from the output signal of the second mixer 33b.

Figure 5G:
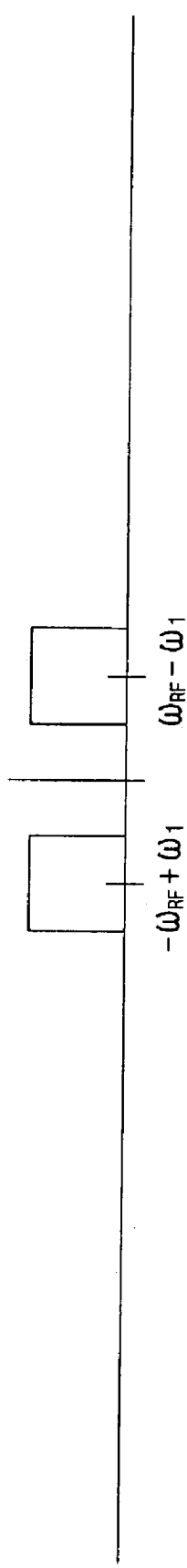

An output signal (D) of the first low-pass filter 34a and an output signal (E) of the second low-pass filter 34b are subtracted in the subtracter 35, and a desired signal is outputted as shown in FIG. 5G. An output signal (F) of the subtracter 35 is mixed with an output signal of the third frequency oscillator 36 in the third mixer 37, and is outputted through the third low-pass filter 38. Herein, the third low-pass filter 38 outputs a base band signal by removing a high frequency signal and passing a low frequency signal. In more detail, the third frequency oscillator 36 outputs a $\omega_{RF}-\omega_1$ frequency signal, and the third low-pass filter 38 outputs a signal having a $$\frac{A_{RF}}{4}$$

size and a center frequency as 0.

Figure 6:
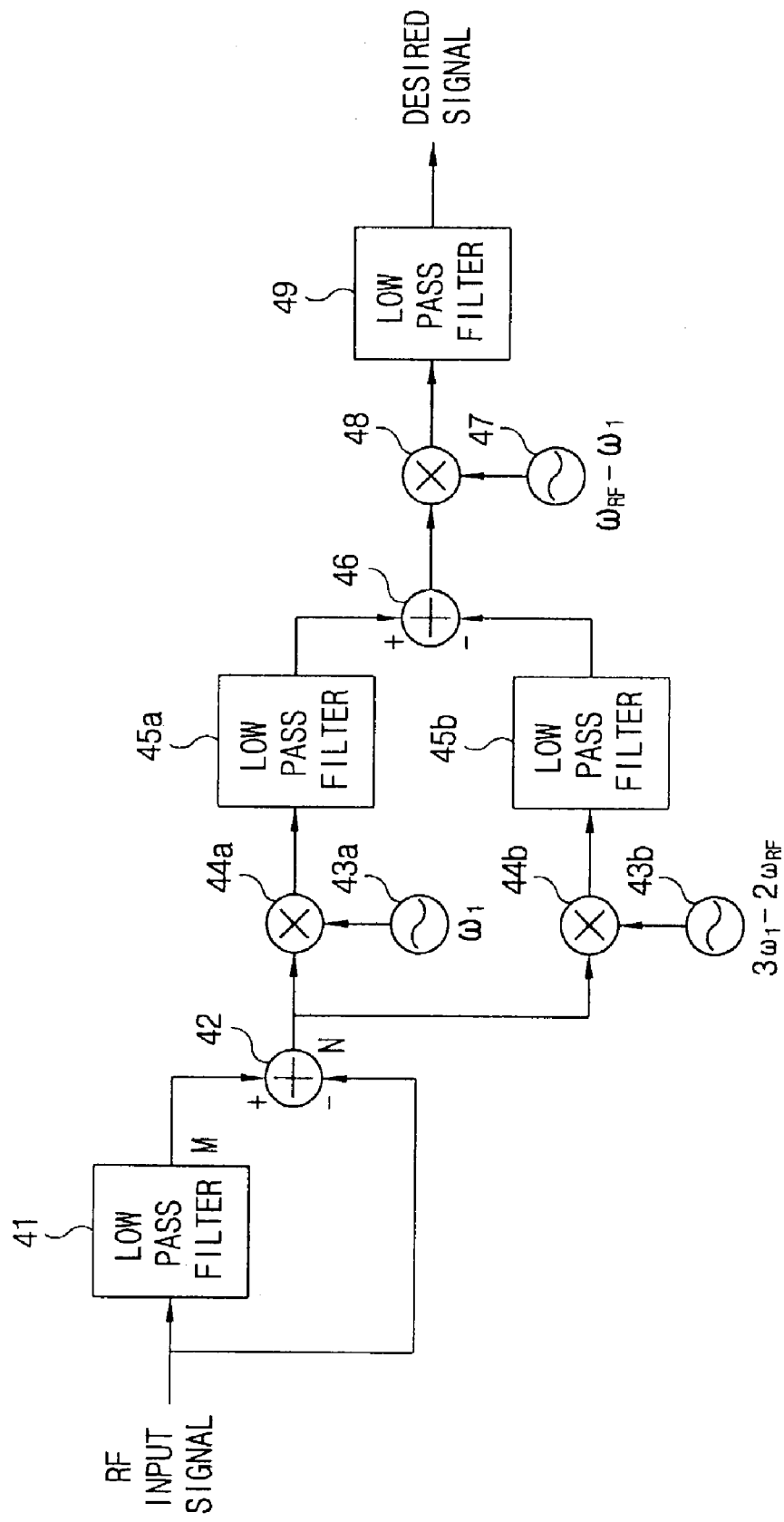
FIG. 6 is a block diagram illustrating a second preferred embodiment of a receiver for rejecting an image signal, in accordance with the present invention.
Figure 7A:
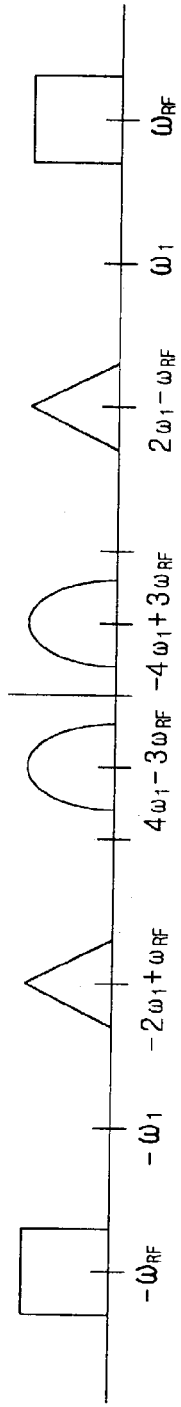
FIGS. 7A–7C are wave diagrams illustrating waveforms generated by the receiver of FIG. 6.
Figure 7B:
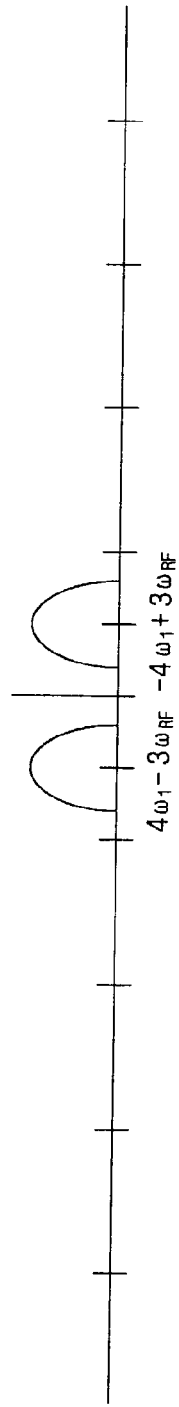
Figure 7C:
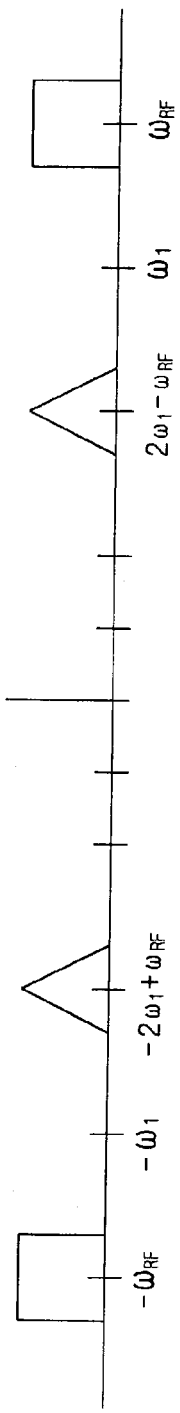

FIG. 6 is a block diagram illustrating a second preferred embodiment of a receiver for rejecting an image signal, in accordance with the present invention, and FIGS. 7A–7C are wave diagrams illustrating waveforms generated by the receiver.

As depicted in FIG. 6, it includes a first low-pass filter 41 for outputting a low frequency signal of an RF input signal; a first subtracter 42 for subtracting the RF input signal from an output signal (M) of the first low-pass filter 41; a first mixer 44a for mixing an output signal (N) of the first subtracter 42 with an $\omega_1$ signal of a first frequency oscillator 43a; a second mixer 44b for mixing the output signal (N) of the first subtracter 42 with a $3\omega_1-2\omega_{RF}$ signal of a second frequency oscillator 43b; a second low-pass filter 45a for outputting a low frequency signal of the output signal of the first mixer 44a; a third low-pass filter 45b for outputting a low frequency signal of the output signal of the second mixer 44b; a second subtracter 46 for subtracting the output signal of the third low-pass filter 45b from the output signal of the second low-pass filter 45a; a third mixer 48 for mixing the output signal of the second subtracter 46 with an output signal of a third frequency oscillator 47; and a fourth low-pass filter 49 for outputting a low frequency of the output signal of the third mixer 48.

In the first preferred embodiment of the present invention, discussed above, it is assumed that a second image signal occurs in a positive (+) frequency region. However, in the second embodiment of the present invention, it is assumed that a second image signal occurs in a negative (−) frequency region.

As depicted in FIG. 7A, a RF input signal includes a desired signal in a positive frequency region, and a first image signal and a second image signal occurred in a negative frequency region. The RF input signal is filtered through the first low-pass filter 41, and accordingly the second image signal is outputted, as depicted in FIG. 7B.

The output signal of the first low-pass filter 41 and the RF input signal are subtracted in the first subtracter 42, and the signal shown in FIG. 7C is outputted. In more detail, a signal obtained by subtracting the second image signal from the RF input signal is outputted.

The output signal of the first subtracter 42 is respectively mixed with a $\omega_1$ signal of the first frequency oscillator 43a and a $3\omega_1-2\omega_{RF}$ signal of the second frequency oscillator 43b in the first mixer 44a and the second mixer 44b. Processing of the output signals of the first mixer 44a and the second mixer 44b is the same as the processing described above in connection with the first embodiment.

In the second preferred embodiment, because the second image signal is in a region less than 0, the output signal of the first frequency oscillator 43a is within the range of $$\frac{2}{3}\omega_{RF} < \omega_1 < \frac{3}{4}\omega_{RF}.$$

Herein, a center frequency of the second image signal is less than 0 and is not overlapped with a center frequency of the first image signal corresponded to the negative region. In order to make the center frequency of the second image signal less than 0, a condition as $4\omega_1-3\omega_{RF}<0$ is required. In order to make the center frequency of the second image signal not overlap with the center frequency of the first image signal, the condition $-2\omega_1-\omega_{RF}<4\omega_1-3\omega_{RF}$ is required, and accordingly the region $$\frac{2}{3}\omega_{RF} < \omega_1 < \frac{3}{4}\omega_{RF}$$

is obtained.

As described above, the first embodiment and the second embodiment of the receiver for rejecting an image signal in accordance with the present invention respectively use an $\omega_1$ that falls in two different ranges, such as $$\frac{3}{4}\omega_{RF} < \omega_1 < \omega_{RF}$$

and $$\frac{2}{3}\omega_{RF} < \omega_1 < \frac{3}{4}\omega_{RF}.$$

However, t is also possible to apply the present invention when $\omega_1$ is out of the above-mentioned range. In addition, several ranges of $\omega_1$ can be used, a +/− sign of a $3\omega_1-2\omega_{RF}$ frequency of a first frequency oscillator can be changed, and the RF input signal and the structure of the input block can be changed.

As described above, in the present invention, by eliminating a phase-shifter, phase imbalance and gain mismatch due to capacitor variations can be removed.

In addition, by decreasing the number of mixers, which are non-linear devices, harmonic influences due to non-linearities can be reduced.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A receiver for rejecting an image signal, comprising:
   a filter unit for filtering a signal within a predetermined band from a radio frequency (RF) input signal;
   a first signal processor for processing an output signal of the filter unit with a first frequency and outputting a first frequency signal;
   a second signal processor for processing the output signal of the filter unit with a second frequency and outputting a second frequency signal;
   a subtracter for subtracting the second frequency signal from the second signal processing unit from the first frequency signal from the first signal processing unit; and
   a third signal processing unit for mixing an output signal of the subtracter with a third frequency and outputting a base band signal, wherein the first and second frequencies are different frequencies.

2. The receiver of claim 1, wherein the filter unit comprises a band pass filter.

3. The receiver of claim 1, wherein the filter unit comprises:
   a low-pass filter for outputting a low frequency signal of the RE input signal; and
   a subtracter for subtracting the RE input signal from the low frequency signal output by the low-pass filter.

4. The receiver of claim 1, wherein the first signal processing unit comprises:
   a first mixer for down-converting the output signal of the filter unit by mixing it with the first frequency; and
   a first low-pass filter for outputting a low frequency signal of an output signal of the first mixer.

5. The receiver of claim 1, wherein the second signal processing unit comprises:
   a second mixer for down-converting the output signal of the filter unit by mixing it with the second frequency; and
   a second low-pass filter for outputting a low frequency signal of an output signal of the second mixer.

6. The receiver of claim 1, wherein the third signal processing unit comprises;
   a third mixer for down-converting the output signal of the subtracter by mixing it with the third frequency; and
   a third low-pass filter for outputting a low frequency signal of an output signal of the third mixer.

7. A receiver for rejecting an image signal, comprising:
   a band pass filter for passing a predetermined band of a radio frequency (RF) input signal, wherein the RF input signal comprises a desired signal and an image signal;
   a first mixer for mixing an output signal of the band pass filter with an output signal of a first frequency oscillator;
   a first low-pass filter for outputting a low frequency signal of an output signal of the first mixer;
   a second mixer for mixing the output signal of the band pass filter with an output signal of a second frequency oscillator;
   a second low-pass filter for outputting a low frequency signal of an output signal of the second mixer;
   a subtracter for subtracting an output signal of the second low-pass filter from an output signal of the first low-pass filter;
   a third mixer for mixing the output signal of the subtracter with an output signal of a third frequency oscillator; and
   a third low-pass filter for outputting a desired signal by filtering a low frequency of the output signal of the third mixer, wherein the first frequency oscillator and the second frequency oscillator are different.

8. The receiver of claim 7, wherein the image signal comprises:
   a first image signal about the desired signal; and
   a second image signal about the first image signal.

9. The receiver of claim 7, wherein the band pass filter rejects the second image signal.

10. The receiver of claim 7, wherein the first frequency oscillator outputs a $\omega_1$ frequency signal which is of a lower frequency than a desired $\omega_{RF}$ frequency signal, and the second frequency oscillator outputs a $3\omega_1-2\omega_{RF}$ frequency signal.

11. The receiver of claim 10, wherein a sign of the $3\omega_1-2\omega_{RF}$ frequency signal of the second frequency oscillator can be +or −.

12. The receiver of claim 7, wherein a desired signal and a first image signal of the output signal of the first low-pass filter have substantially the same center frequency.

13. The receiver of claim 7, wherein the output signal of the second low-pass filter is a first image signal having, substantially the same center frequency as that of the output signal of the first low-pass filter.

14. A receiver for rejecting an image signal, comprising:
   a first low-pass filter for outputting a low frequency of a radio frequency (RF) input signal, wherein the RF input signal comprises a desired signal and an image signal;
   a first subtracter for subtracting the RF input signal from an output signal of the first low-pass filter;
   a first mixer for mixing an output signal of the first subtracter with an output signal of a first frequency oscillator;
   a second low-pass filter for outputting a low frequency signal of an output signal of the first mixer;
   a second mixer for mixing an output signal of the first subtracter with an output signal of a second frequency oscillator;
   a third low-pass filter for outputting a low frequency signal of an output signal of the second mixer;
   a second subtracter for subtracting an output signal of the third low-pass filter from an output signal of the second low-pass filter;

a third mixer for mixing an output signal of the second subtracter with an output signal of a third frequency oscillator; and a fourth low-pass filter for outputting a desired signal by filtering only a low frequency of an output signal of the third mixer.

15. The receiver of claim 14, wherein the image signal comprises:

a first image signal about the desired signal; and a second image signal about the first image signal.

16. The receiver of claim 14, wherein the first low-pass filter and the first subtracter together reject the second image signal.

17. The receiver of claim 14, wherein the first frequency oscillator outputs a $\omega_1$ frequency signal which is of a lower frequency than a desired $\omega_{RF}$ frequency signal, and the second frequency oscillator outputs a $3\omega_1 - 2\omega_{RF}$ frequency signal.

18. The receiver of claim 17, wherein a sign of the $3\omega_1 -2\omega_{RF}$ frequency signal of the second frequency oscillator can be + or −.

19. The receiver of claim 14, wherein a desired signal and a first image signal of the output signal of the second low-pass filter have substantially the same center frequency.

20. The receiver of claim 14, wherein an output signal of the third low-pass filter is a first image signal having substantially the same center frequency as that of an output signal of the second low-pass filter.

21. A receiver, comprising:

a first signal processor for down-converting at least a portion of a radio frequency (RF) input signal using a first signal and outputting a first down-converted signal;

a second signal processor for down-converting the at least a portion of the RF signal using a second signal and outputting a second down-converted signal; and a subtracter for subtracting the second down-converted signal from the first down-converted signal, wherein at least one of the first and second signal processors include a low pass filter, and the first and second signals have different frequencies.

22. The receiver of claim 21, wherein the first signal processor comprises:

a first mixer for mixing the at least a portion of the RF signal with the first signal from a first oscillator and outputting the first down-converted signal; and a first low pass filter for filtering the first down-converted signal.

23. The receiver of claim 22, wherein the second signal processor comprises:

a second mixer for mixing the at least a portion of the RF signal with the second signal from a second oscillator and outputting the second down-converted signal; and a second low pass filter for filtering the second down-converted signal.

24. The receiver of claim 21, further comprising a third signal processor for down-converting a signal output from the subtracter and outputting a base band signal.

25. The receiver of claim 24, wherein the third signal processor comprises:

a mixer for mixing the signal output from the subtracter with a signal from a third oscillator; and a low pass filter for filtering an output of the mixer and outputting the base band signal.

26. A receiver, comprising:

a first signal processor for down-converting at least a portion of a radio frequency (RF) signal and outputting a first down-converted signal;

a second signal processor for down-converting the at least a portion of the RF signal and outputting a second-down-converted signal; and a subtracter for subtracting the second down-converted signal from the first down-converted signal, wherein neither of the first and second down-converted signals undergo phase shifting prior to entering the subtracter.

27. A method of obtaining a desired frequency component from a radio frequency (RF) signal, comprising:

down-converting at least a portion of the RF signal using a signal from a first oscillator to yield a first down-converted signal;

down-converting the at least a portion of the RF signal using a signal from a second oscillator to yield a second down-converted signal; and subtracting the second down-converted signal from the first down-converted signal to yield a third signal wherein the signal from the first oscillator and the signal from the second oscillator have different frequencies.

28. A method of removing an undesired frequency component from a radio frequency (RF) signal, comprising:

down-converting at least a portion of the RF signal using a first signal to yield a first down-converted signal;

down-converting the at least a portion of the RF signal using a second signal to yield a second down-converted signal; and subtracting the second down-converted signal from the first down-converted signal before phase-shifting either of the first and second down-converted signals to yield a third signal, wherein the first and second signals have different frequencies.

* * * * *